(12) United States Patent
Zhou et al.

(10) Patent No.: US 12,136,649 B2
(45) Date of Patent: Nov. 5, 2024

(54) DEEP TRENCH ISOLATION STRUCTURES WITH A SUBSTRATE CONNECTION

(71) Applicant: GlobalFoundries Singapore Pte. Ltd., Singapore (SG)

(72) Inventors: Jianbo Zhou, Singapore (SG); Shiang Yang Ong, Singapore (SG); Namchil Mun, Singapore (SG); Hung Chang Liao, Singapore (SG); Zhongxiu Yang, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 345 days.

(21) Appl. No.: 17/723,665

(22) Filed: Apr. 19, 2022

(65) Prior Publication Data

US 2023/0335583 A1 Oct. 19, 2023

(51) Int. Cl.
*H01L 29/00* (2006.01)
*H01L 21/762* (2006.01)
*H01L 29/06* (2006.01)

(52) U.S. Cl.
CPC ........ *H01L 29/0649* (2013.01); *H01L 21/762* (2013.01)

(58) Field of Classification Search
CPC ............... H01L 29/0649; H01L 21/762; H01L 21/763; H01L 21/76224; H01L 27/1207; H01L 21/76264; H01L 21/76895; H01L 23/481

USPC .......................................................... 257/506
See application file for complete search history.

(56) References Cited

U.S. PATENT DOCUMENTS

| | | | |
|---|---|---|---|
| 4,983,226 A | 1/1991 | Hunter et al. | |
| 7,038,289 B2 | 5/2006 | Marty et al. | |
| 7,679,130 B2 | 3/2010 | Tilke et al. | |
| 2019/0109039 A1* | 4/2019 | Dong | H01L 29/7816 |
| 2023/0261062 A1* | 8/2023 | Raghunathan | H01L 21/76224 257/659 |

* cited by examiner

*Primary Examiner* — Theresa T Doan
(74) *Attorney, Agent, or Firm* — Thompson Hine LLP; Francois Pagette

(57) ABSTRACT

Semiconductor structures including a deep trench isolation structure and methods of forming a semiconductor structure including a deep trench isolation structure. The semiconductor structure includes a semiconductor substrate having a device region, and a deep trench isolation structure in the semiconductor substrate. The deep trench isolation structure further includes a first portion, a second portion adjacent to the first portion, and a conductor layer in the first portion and the second portion. The conductor layer in the first portion of the deep trench isolation structure surrounds the device region. The conductor layer in the second portion of the deep trench isolation structure defines an electrical connection to the semiconductor substrate.

20 Claims, 10 Drawing Sheets

DEEP TRENCH ISOLATION STRUCTURES WITH A SUBSTRATE CONNECTION

BACKGROUND

The disclosure relates to semiconductor device and integrated circuit fabrication and, in particular, to semiconductor structures including a deep trench isolation structure and methods of forming a deep trench isolation structure.

Power semiconductor devices may be utilized in automotive, consumer, and industrial applications, such as power supplies and power converters. Load current may be conducted by one or more power cells of the power semiconductor device. Each power cell may be electrically isolated by a deep trench isolation region. The deep trench isolation region may function as a substrate pickup that collects and drains charge to avoid charge accumulation capable of causing damage to the power semiconductor device.

Improved semiconductor structures including a deep trench isolation structure and methods of forming a structure including a deep trench isolation structure are needed.

SUMMARY

In an embodiment of the invention, a semiconductor structure comprises a semiconductor substrate having a device region, and a deep trench isolation structure in the semiconductor substrate. The deep trench isolation structure includes a first portion, a second portion adjacent to the first portion, and a conductor layer in the first portion and the second portion. The conductor layer in the first portion of the deep trench isolation structure surrounds the device region. The conductor layer in the second portion of the deep trench isolation structure defines an electrical connection to the semiconductor substrate.

In an embodiment of the invention, a method comprises forming a deep trench isolation structure in a semiconductor substrate. The deep trench isolation structure includes a first portion, a second portion adjacent to the first portion, and a conductor layer in the first portion and the second portion. The conductor layer in the first portion of the deep trench isolation structure surrounds a device region of the semiconductor substrate. The conductor layer in the second portion of the deep trench isolation structure defines an electrical connection to the semiconductor substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
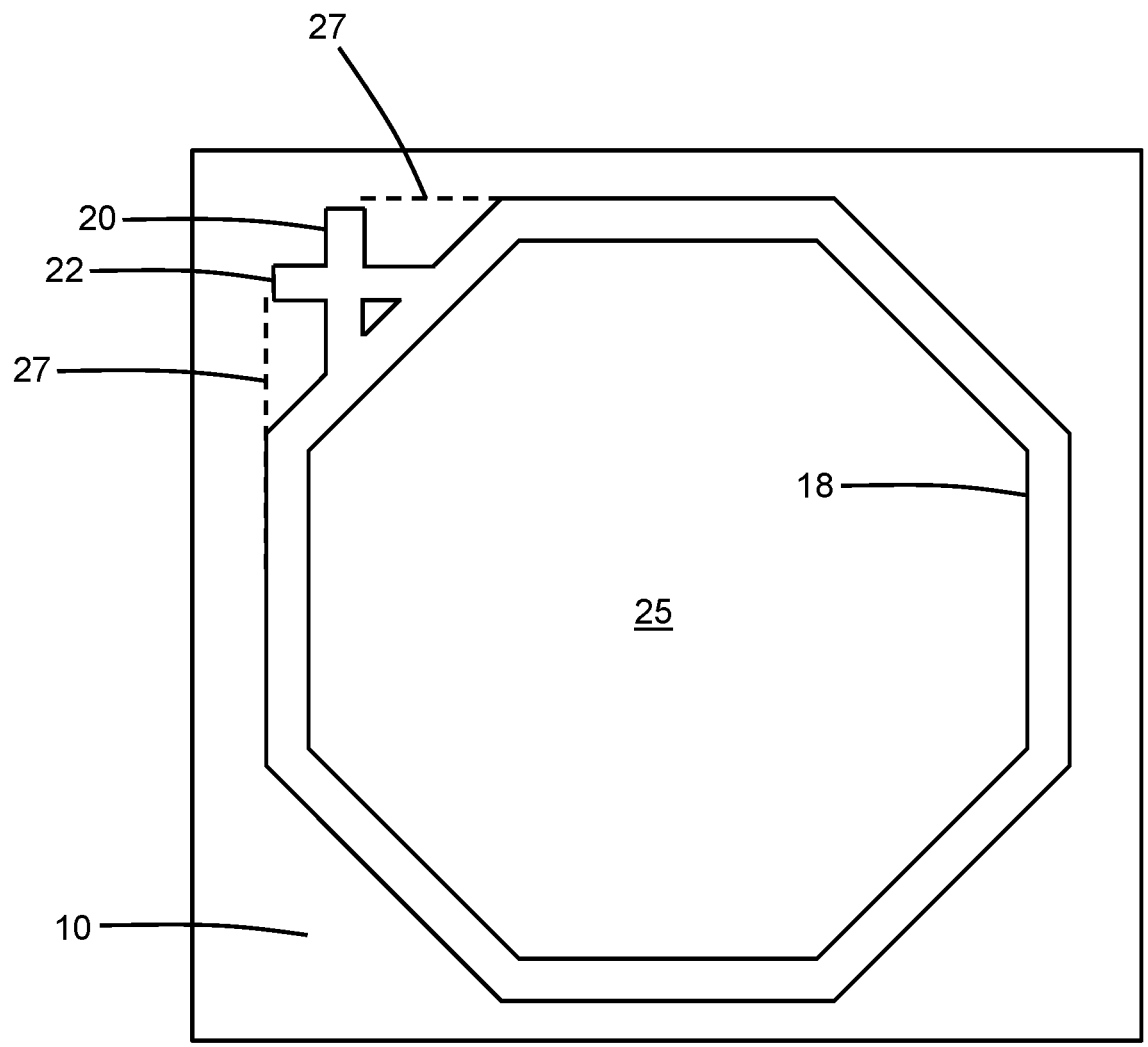
FIG. 1 is a top view of a structure at an initial fabrication stage of a processing method in accordance with embodiments of the invention.
Figure 1A:
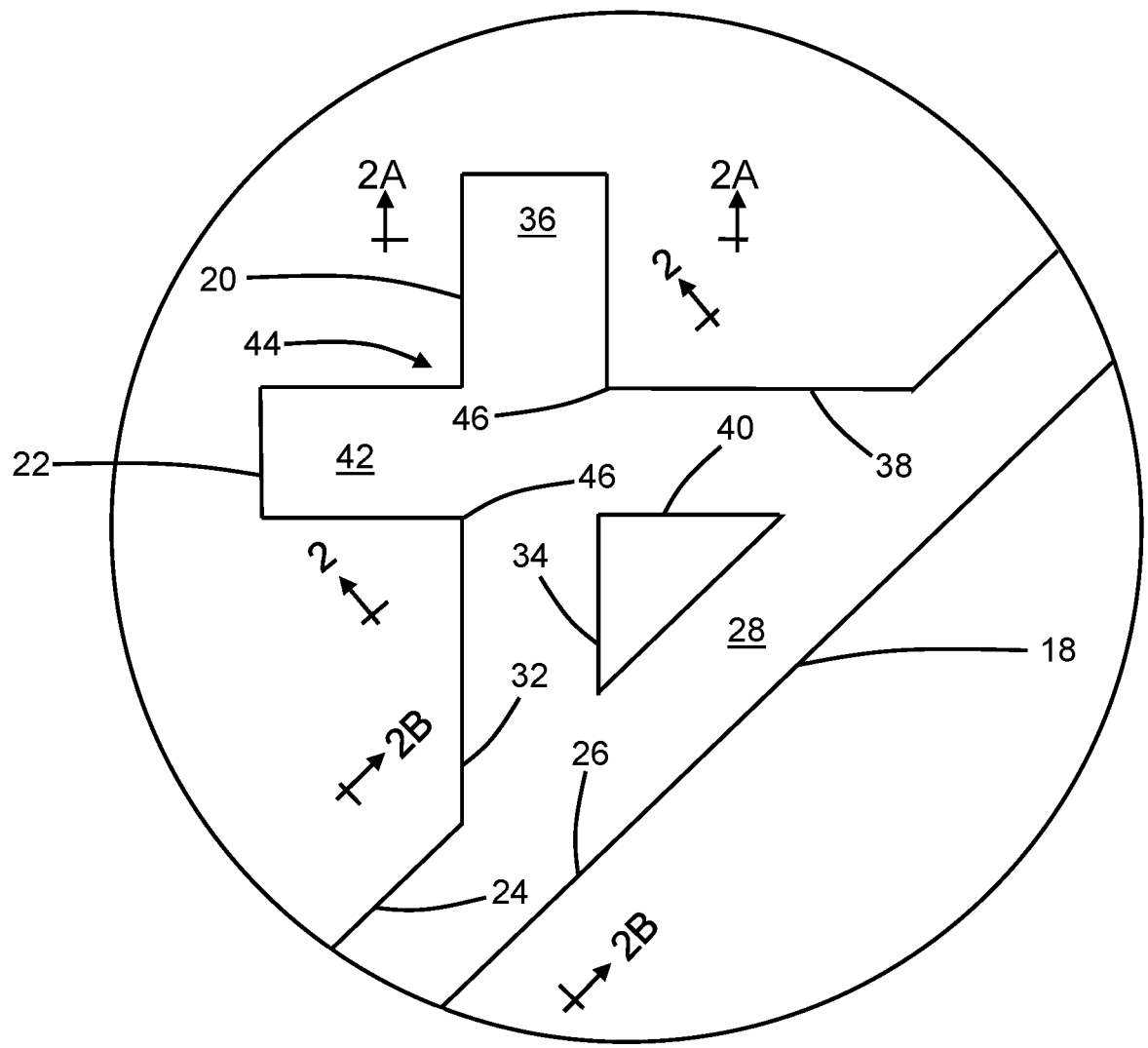
FIG. 1A is an enlarged view of a portion of FIG. 1.

With reference to FIGS. 1, 1A, 2, 2A, 2B and in accordance with embodiments of the invention, a semiconductor substrate 10 may include a semiconductor layer 12 and an isolation well 14. The semiconductor substrate 10 may be comprised of semiconductor material, such as single-crystal silicon. In an embodiment, the semiconductor layer 12 and isolation well 14 may be doped with an n-type dopant, such as arsenic or phosphorus, to have n-type conductivity, and the portion of the semiconductor substrate 10 beneath the isolation well 14 may be doped with a p-type dopant, such as boron, to have p-type conductivity.

Deep trenches 18, 20, 22 are formed in the semiconductor substrate 10. The deep trenches 18, 20, 22 may be patterned by lithography and etching processes. To that end, an etch mask may be formed by a lithography process over the semiconductor substrate 10. The etch mask may include a layer of photoresist that is applied by a spin-coating process, pre-baked, exposed to light projected through a photomask, baked after exposure, and developed with a chemical developer to define a set of openings for forming the deep trenches 18, 20, 22. An etching process is used to form the deep trenches 18, 20, 22 after the etch mask is formed, and the etch mask may be stripped by, for example, ashing after the deep trenches 18, 20, 22 are formed. In an embodiment, the deep trenches 18, 20, 22 may penetrate through the semiconductor layer 12 and isolation well 14 into the oppositely-doped portion of the semiconductor substrate 10 beneath the isolation well 14.

The deep trench 18 fully surrounds a device region 25 of the semiconductor substrate 10 in which a device structure may be subsequently formed. In an embodiment, the deep trench 18 may be constituted by a multi-sided closed geometrical shape that fully surrounds the device region 25. In an embodiment, the deep trench 18 may have a multi-sided closed shape that is octagonal with sides arranged as segments to define an octagon that fully surrounds the device region 25. The isolation well 14 may electrically isolate the device region 25 from the oppositely-doped portion of the semiconductor substrate 10 beneath the isolation well 14.

The deep trench 18 has an outer sidewall 24 and an inner sidewall 26 that penetrate into the semiconductor substrate 10 to a surface at a bottom 28. Similarly, the deep trench 20 has sidewalls 32, 34 that penetrate into the semiconductor substrate 10 to a surface at a bottom 36, and the deep trench 22 has sidewalls 38, 40 that penetrate into the semiconductor substrate 10 to a surface at a bottom 42. The sidewalls 32, 34 of the deep trench 20 intersect the sidewalls 38, 40 of the deep trench 22 to define a shared region 44 of intersection. In the shared region 44, the bottom 36 of the deep trench 20 and the bottom 42 of the deep trench 22 are coincident over an area. The bottoms 28, 36, 42 may be located at a depth of, for example, about 30 microns relative to the front surface 11 of the semiconductor substrate 10.

Corners 46 are defined by the intersection of the sidewalls 32, 34 of the deep trench 20 with the sidewalls 38, 40 of the deep trench 22. The corners 46 are arranged about the outer boundary of the shared region 44, and planes connecting adjacent corners 46 may define an outer perimeter for the shared region 44. In an embodiment, the corners 46 may be right-angle corners. In an alternative embodiment, the corners 46 may be chamfered corners. In an alternative embodiment, the corners 46 may be rounded corners.

The deep trench 20 may be aligned at an angle relative to the deep trench 22. In an embodiment, the deep trench 20 may cross or extend across the deep trench 22 to define the arms of a cross shape. In an embodiment, the deep trench 20 may be aligned perpendicular to the deep trench 22. In an embodiment, the deep trench 20 may be aligned substantially perpendicular to the deep trench 22.

The deep trenches 20, 22 are positioned adjacent to a portion of the deep trench 18. In the representative embodiment, the deep trenches 20, 22 are connected with (i.e., intersect) the deep trench 18 to define a continuous opening in the semiconductor substrate 10. In an embodiment, the deep trenches 20, 22 may be located in a redundant area of the semiconductor substrate 10 that is normally unused. In the representative embodiment in which the deep trench 18 is octagonal, the redundant area encompassing the deep trenches 20, 22 is located adjacent to one side of the octagon, and the redundant area encompassing the deep trenches 20, 22 is inset inside tangent lines 27 to the sides of the octagon that adjoin the side of the octagon adjacent to the deep trenches 20, 22.

The deep trench 18 has a width dimension W1 at the front surface 11 of the semiconductor substrate 10, and the deep trenches 20, 22 have a width dimension W2 at the front surface 11 of the semiconductor substrate 10. The width dimension W1 of the deep trench 18 is a perpendicular distance that may be measured between the opposite sidewalls 24, 26, and the width dimension W1 may be constant or substantially constant over the entire perimeter of the deep trench 18. The width dimension W2 of the deep trench 20 may be defined as a perpendicular distance measured between the opposite sidewalls 32, 34, and the width dimension W2 may be constant or substantially constant over the portions of the length of the deep trench 20 on either side of the shared region 44. The width dimension W2 of the deep trench 22 may be a perpendicular distance measured between the opposite sidewalls 38, 40, and the width dimension W2 may be constant or substantially constant over the portions of the length of the deep trench 22 on either side of the shared region 44. In an embodiment, the width dimension W2 of the deep trenches 20, 22 may be equal or substantially equal to the width dimension W1 of the deep trench 18.

The deep trenches 20, 22 intersect in the shared region 44 to define corners 46 at the intersection locations. Opposite corners 46 of the shared region 44, which are non-adjacent, are spaced apart on a diagonal by a width dimension W3. The width dimension W3 is greater than the width dimension W1 of the deep trench 18, the width dimension W2 of the deep trench 20, and the width dimension W2 of the deep trench 22. The larger width dimension W3 is a result of the shape of the shared region 44 produced by the intersection of the deep trenches 20, 22. In the representative embodiment, the shared region 44 projects in a vertical direction to a rectangular area over the coincident bottoms 36, 42 of the deep trenches 20, 22, and the rectangular area includes two pairs of opposite corners 46 and a pair of diagonals represented by line segments linking the opposite corners 46. In an embodiment, the shared region 44 may project in a vertical direction to a square area over the coincident bottoms 36, 42 of the deep trenches 20, 22, and the square area includes two pairs of opposite corners 46 and a pair of diagonals represented by line segments linking the opposite corners 46. The coincident bottoms 36, 42 represent a portion of the entire bottom 36 of the deep trench 20 and a portion of the entire bottom 42 of the deep trench 22.

Figure 2:
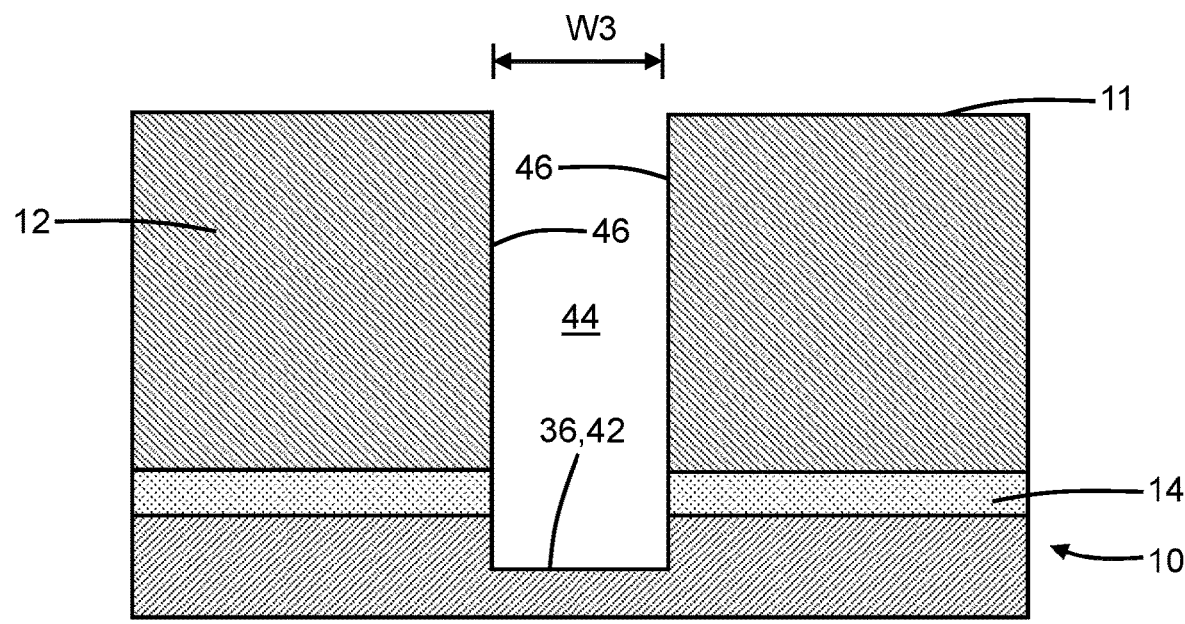
FIG. 2 is a cross-sectional view taken generally along line 2-2 in FIG. 1A.
Figure 2A:
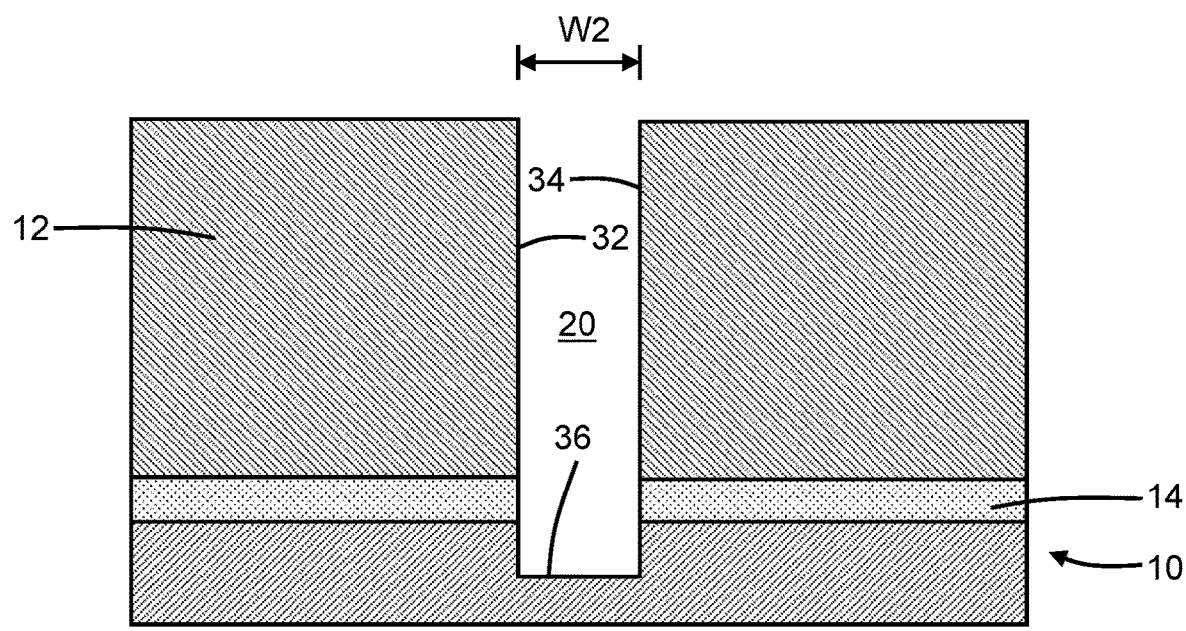
FIG. 2A is a cross-sectional view taken generally along line 2A-2A in FIG. 1A.
Figure 2B:
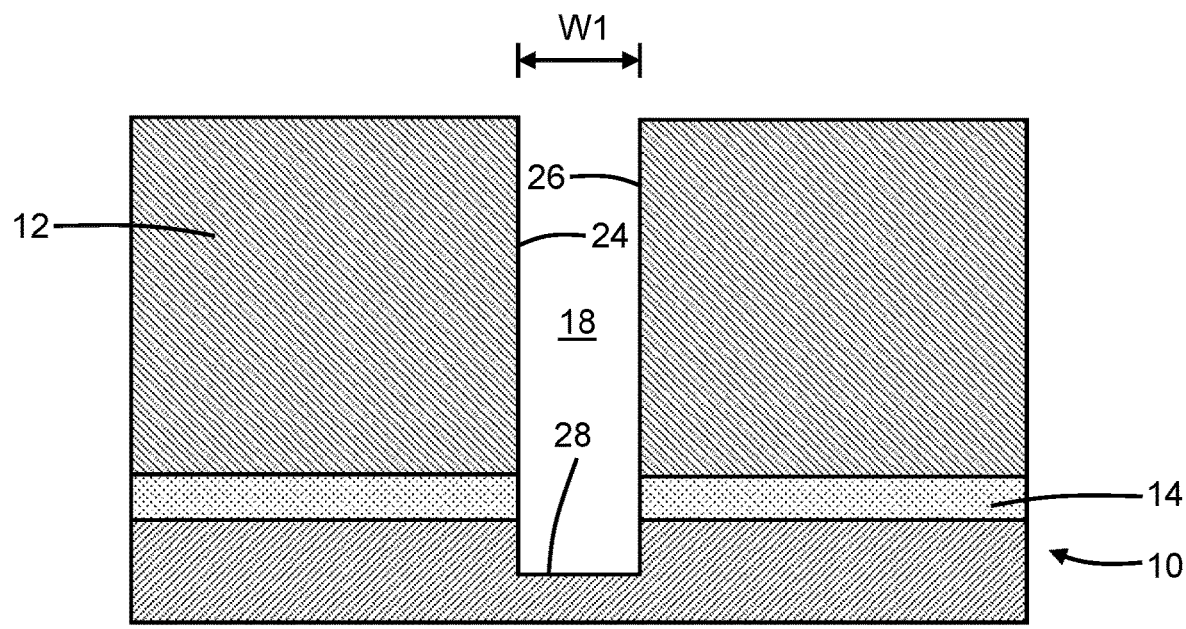
FIG. 2B is a cross-sectional view taken generally along line 2B-2B in FIG. 1A.
Figure 3:
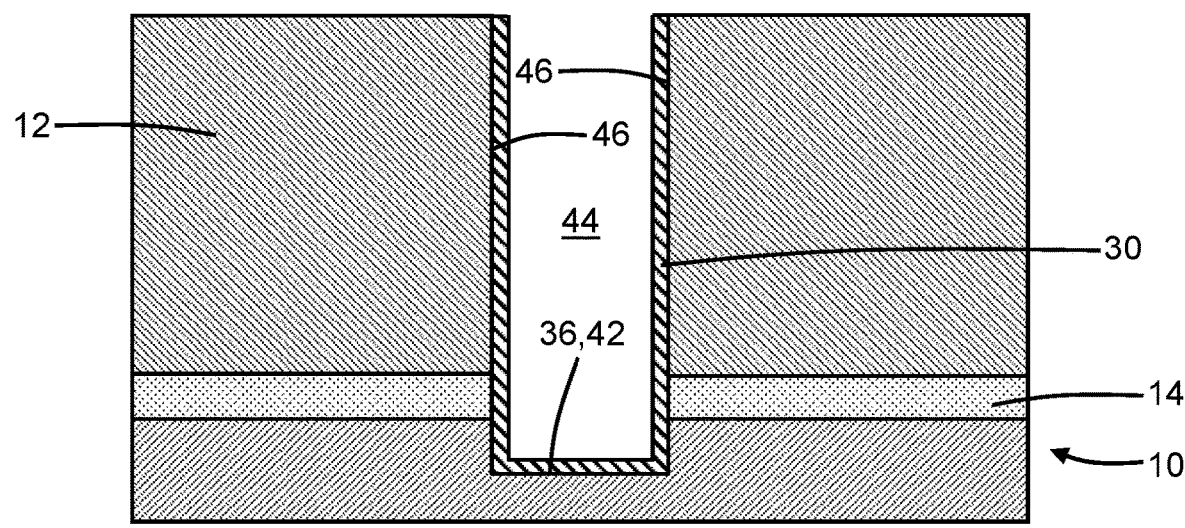
FIGS. 3, 3A, and 3B are cross-sectional views at a fabrication stage subsequent to FIGS. 2, 2A, and 2B.
Figure 3A:
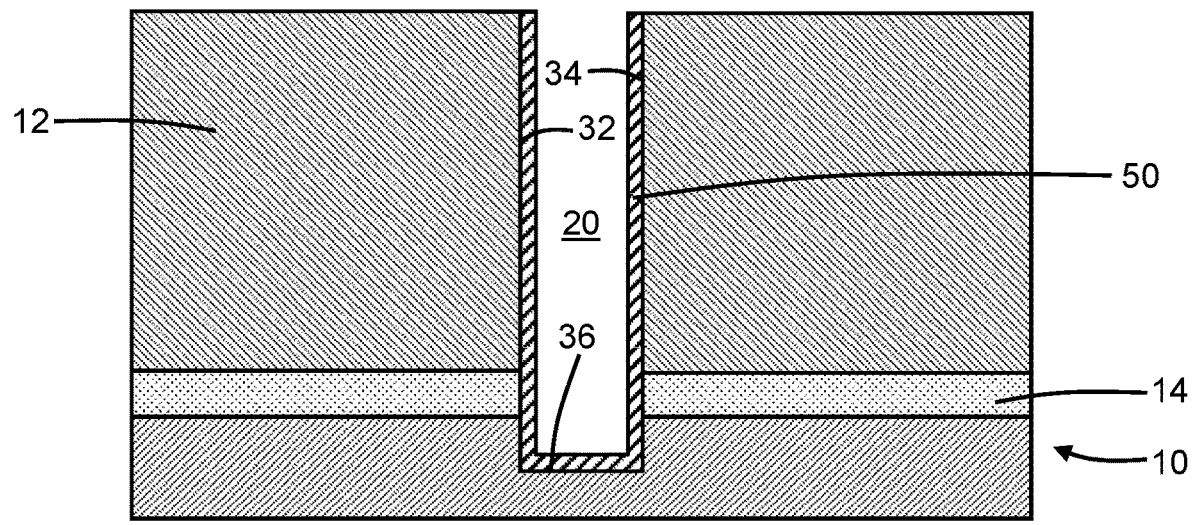
Figure 3B:
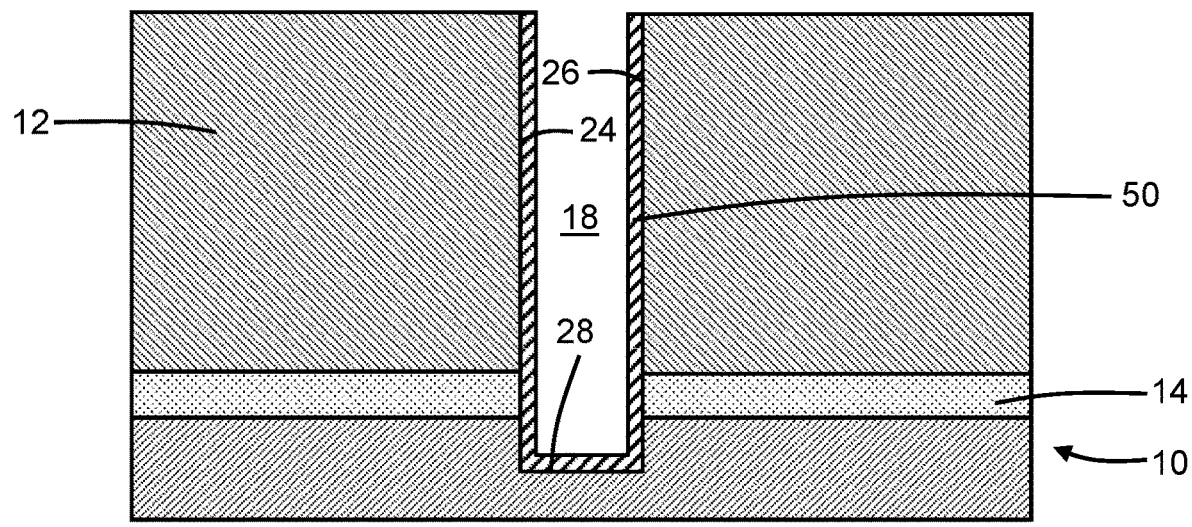

With reference to FIGS. 3, 3A, 3B in which like reference numerals refer to like features in FIGS. 2, 2A, 2B and at a subsequent fabrication stage, a dielectric liner 50 is formed on the sidewalls 24, 26 and bottom 28 of the deep trench 18, the sidewalls 32, 34 and bottom 36 of the deep trench 20, and the sidewalls 38, 40 and bottom 42 of the deep trench 22. In an embodiment, the dielectric liner 50 may be in direct contact with the sidewalls 24, 26 and bottom 28 of the deep trench 18, the sidewalls 32, 34 and bottom 36 of the deep trench 20, and the sidewalls 38, 40 and bottom 42 of the deep trench 22. The dielectric liner 50 may be comprised of a dielectric material, such as silicon dioxide, and the dielectric liner 50 may have a conformal thickness on the contacted surfaces.

Figure 4:
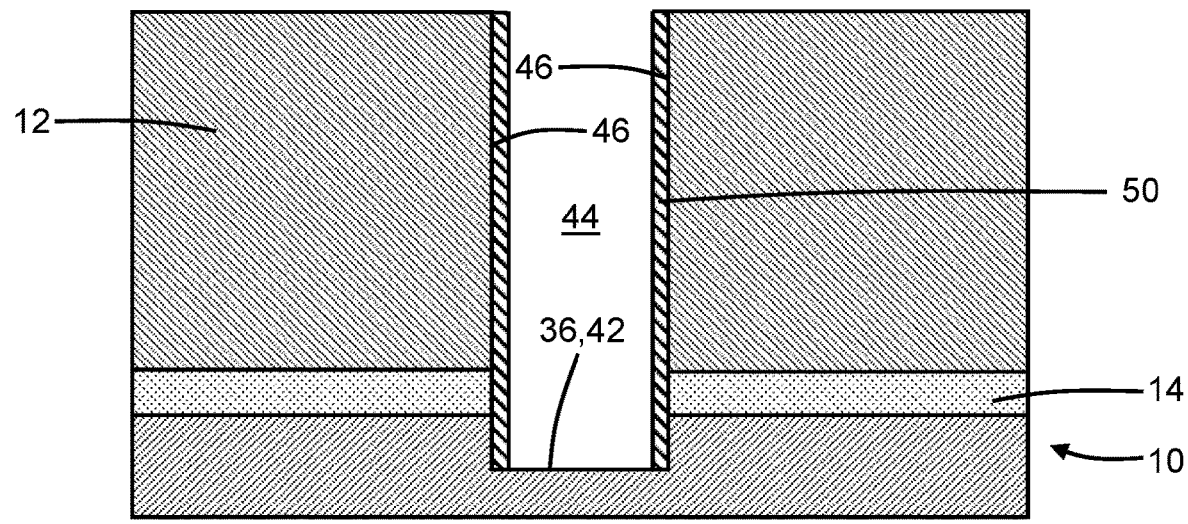
FIGS. 4, 4A, and 4B are cross-sectional views at a fabrication stage subsequent to FIGS. 3, 3A, and 3B.
Figure 4A:
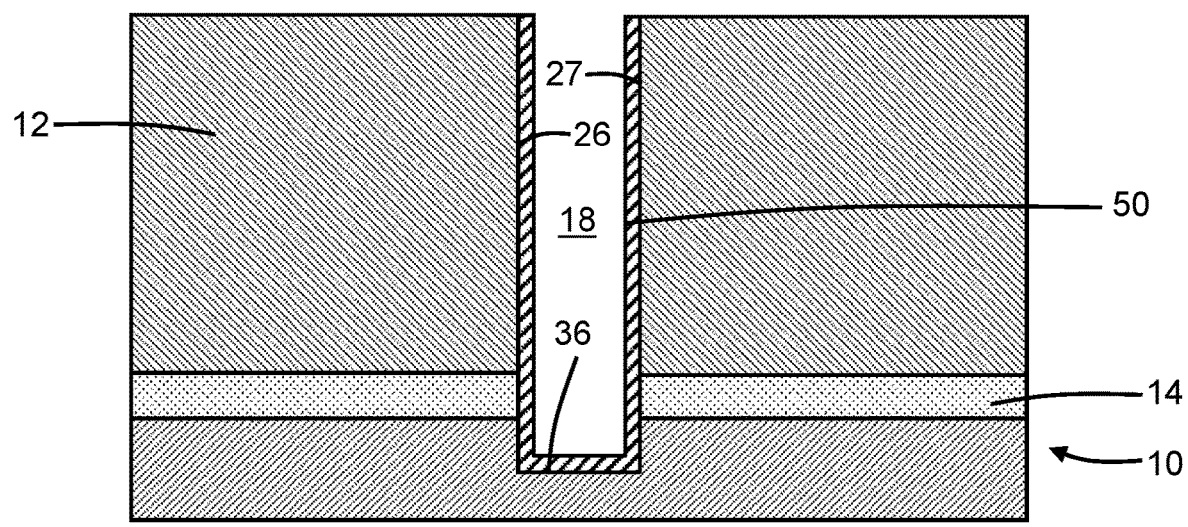
Figure 4B:
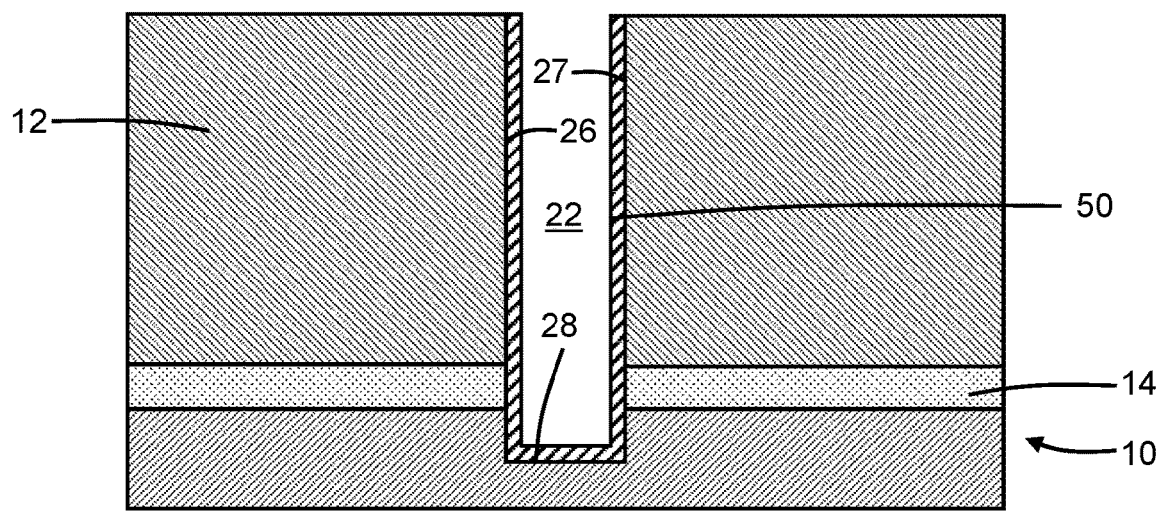

With reference to FIGS. 4, 4A, 4B in which like reference numerals refer to like features in FIGS. 3, 3A, 3B and at a subsequent fabrication stage, the dielectric liner 50 may be etched by an etching process, such as a dry etching process. The etching process fully removes the dielectric liner 50 from the coincident bottoms 36, 42 of the deep trenches 20, 22 in the shared region 44 to expose the underlying surface of the semiconductor substrate 10 over the area of the shared region 44. The dielectric liner 50 is thinned, but not removed, from the bottom 28 of the deep trench 18, the bottom 36 of the deep trench 20 outside of the shared region 44, and the bottom 42 of the deep trench 22 outside of the shared region 44. The larger width dimension W3 in the shared region 44, and the concomitant lower aspect ratio locally in shared region 44, permits the dielectric liner 50 to be removed by the etching process from the coincident portions of the bottoms 36, 42 of the deep trenches 20, 22, whereas the narrower width dimensions W1, W2 of the deep trenches 18, 20, 22 outside of the shared region 44, and the concomitant higher aspect ratio, prevents the complete removal of the dielectric liner 50 by the etching process from the bottom 28 of the deep trench 18 and non-coincident portions of the bottoms 36, 42 of the deep trenches 20, 22.

Figure 5:
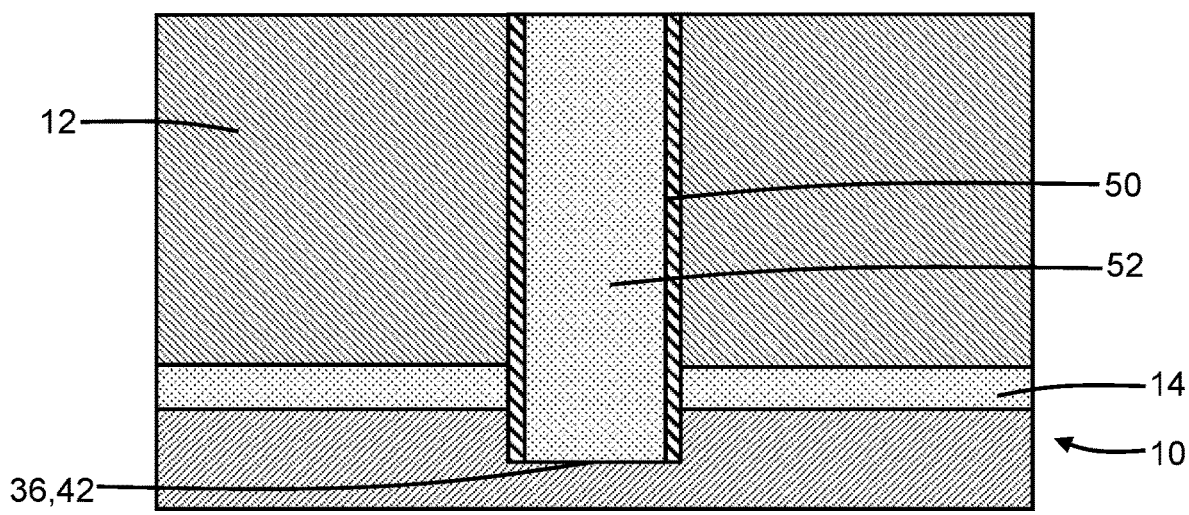
FIGS. 5, 5A, and 5B are cross-sectional views at a fabrication stage subsequent to FIGS. 4, 4A, and 4B.
Figure 5A:
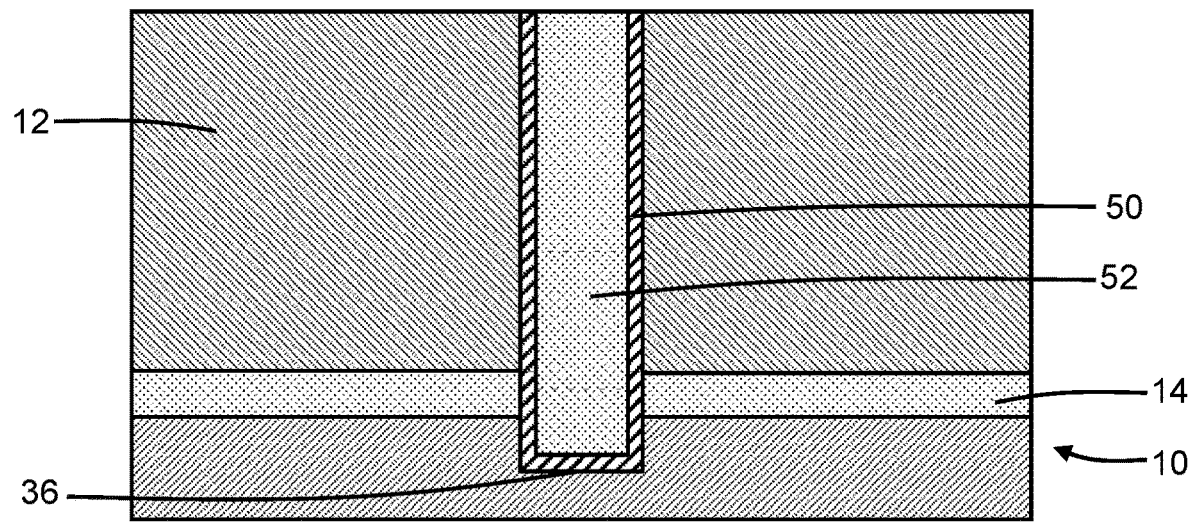
Figure 5B:
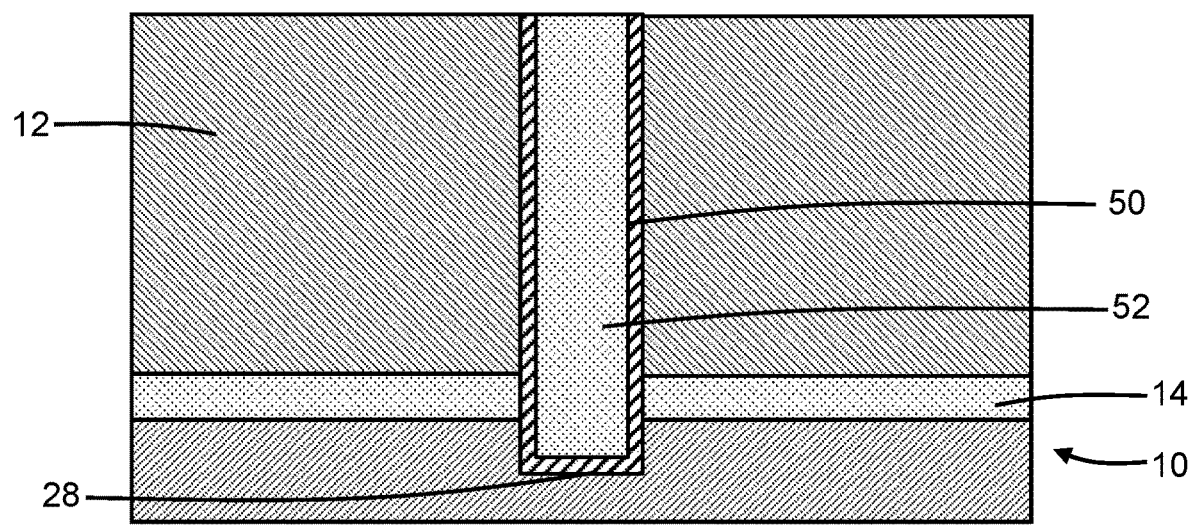

With reference to FIGS. 5, 5A, 5B in which like reference numerals refer to like features in FIGS. 4, 4A, 4B and at a subsequent fabrication stage, a conductor layer 52 is formed as a conductive core inside the deep trench 18, 20, 22. The conductor layer 52 may be comprised of a metal, such as doped polysilicon, that is deposited and planarized by chemical-mechanical polishing. The dielectric liner 50 and conductor layer 52 that are positioned in the deep trench 18, 20, 22 collectively define a deep trench isolation structure. The dielectric liner 50 is positioned in a lateral direction between the conductor layer 52 inside the deep trench 18 and the device region 25 (FIG. 1) of the semiconductor substrate 10. The dielectric liner 50 is also positioned in a vertical direction between the conductor layer 52 and the bottom 28 of the deep trench 18, the bottom 36 of the deep trench 20 outside of the shared region 44 (FIG. 1), and the bottom 42 of the deep trench 22 outside of the shared region 44.

The dielectric liner 50 is absent in a vertical direction between the conductor layer 52 and the semiconductor substrate 10 beneath the deep trenches 20, 22 in the shared region 44 over which the deep trench 20 and the deep trench 22 have coincident bottoms 36, 42. Instead, the conductor layer 52 directly contacts the semiconductor material of the semiconductor substrate 10 in shared region 44, which provides an electrically-conductive connection between the conductor layer 52 and the semiconductor substrate 10. The dielectric liner 50 electrically isolates the conductor layer 52 from the semiconductor substrate 10 outside of the shared region 44. In the shared region 44, the coincident bottoms 36, 42 of the deep trenches 20, 22 are of the dielectric liner 50.

Figure 6:
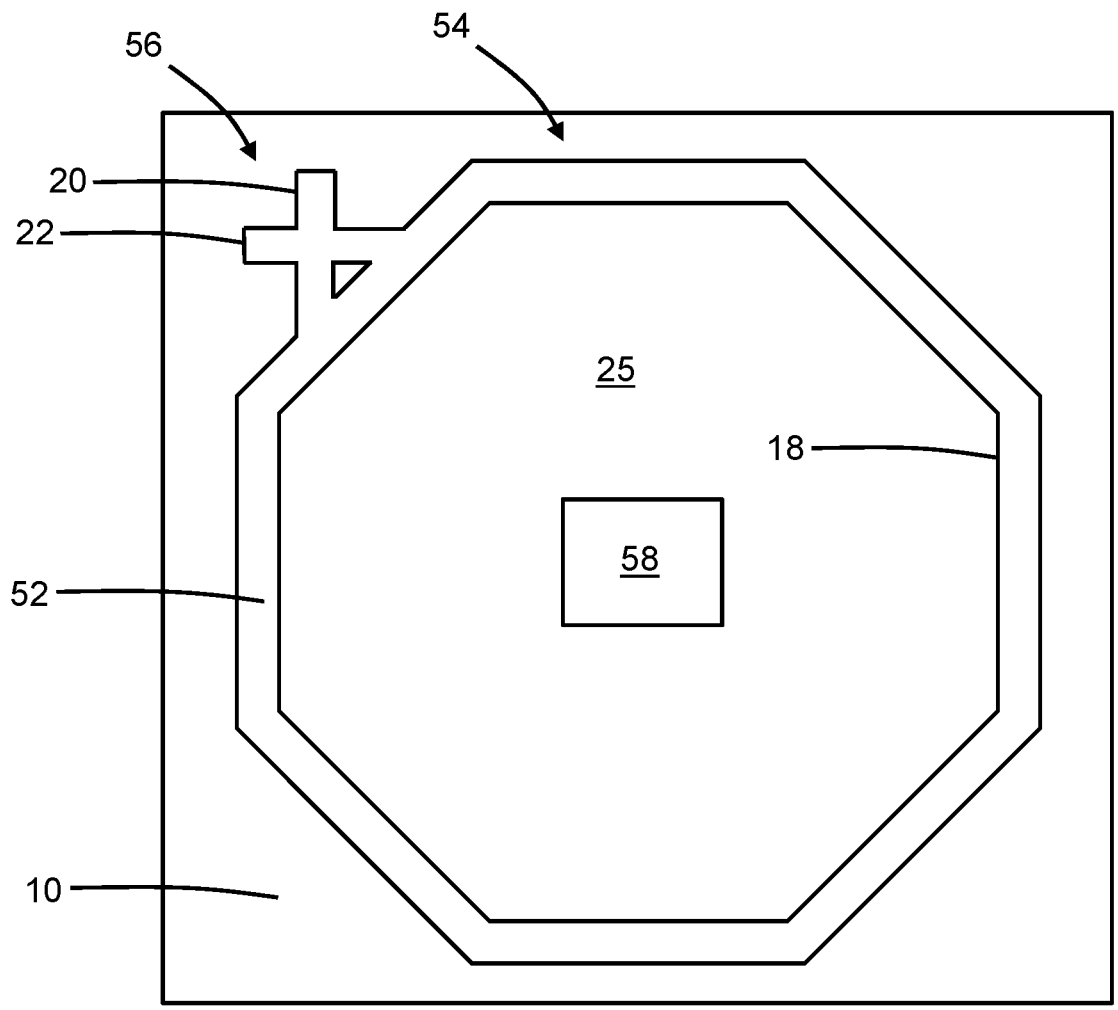
FIG. 6 is a top view at a fabrication stage subsequent to FIGS. 5, 5A, and 5B.

With reference to FIG. 6 in which like reference numerals refer to like features in FIGS. 5, 5A, 5B and at a subsequent fabrication stage, the deep trench isolation structure defined by the conductor layer 52 and dielectric liner 50 (FIGS. 5, 5A, 5B) located inside the deep trenches 18, 20, 22 includes a portion 54 within the deep trench 18 that electrically isolates the device region 25 from a surrounding portion of the semiconductor substrate 10 and a portion 56 in the shared region 44 (FIG. 1) that, through direct contact between the conductor layer 52 and the semiconductor substrate 10 over the shared region 44, defines an electrical connection of the conductor layer 52 to the semiconductor substrate 10. The conductor layer 52 in the portion 54 of the deep trench isolation structure fully surrounds the device region. The conductor layer 52 in the portion 54 of the deep trench isolation structure and the conductor layer 52 in the portion 56 of the deep trench isolation structure are physically and electrically continuous.

A device 58 may be formed in the device region 25. In an embodiment, the device 58 may be a power semiconductor device. Middle-of-line processing and back-end-of-line processing follow, which includes formation of contacts, vias, and wiring for an interconnect structure coupled with the device 58, as well as with the conductor layer 52.

Figure 7:
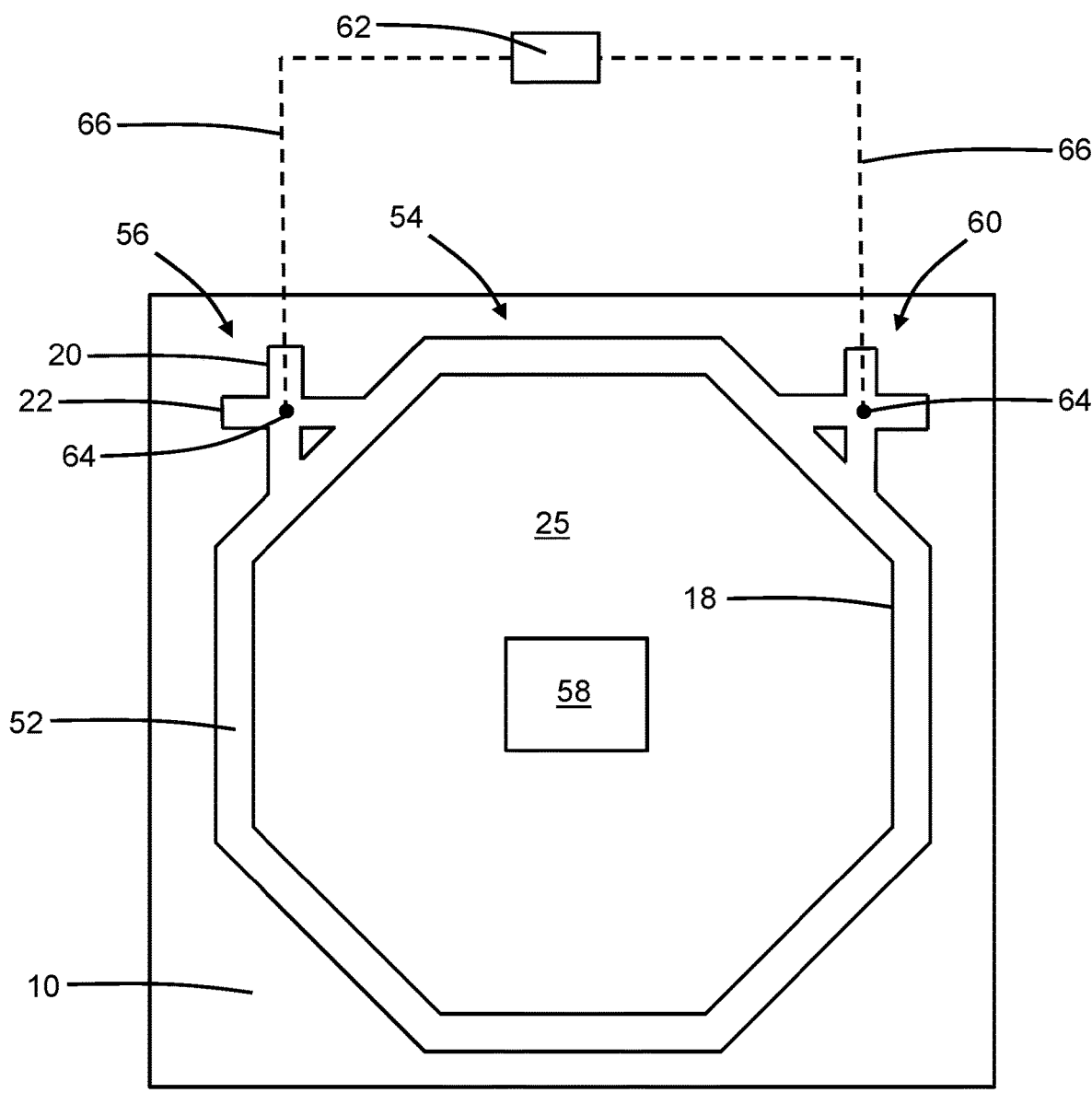
FIG. 7 is a top view of a structure in accordance with alternative embodiments of the invention.

With reference to FIG. 7 and in accordance with alternative embodiments, the portion 56 of the deep trench isolation structure may be replicated to provide additional electrically-conductive connections between the conductor layer 52 and the semiconductor substrate 10. In an embodiment, the deep trench isolation structure may include a portion 60 that is arranged at a different location about the perimeter of the portion 54 of the deep trench isolation structure. The portion 60 of the deep trench isolation structure includes trenches and a region respectively similar to deep trenches 20, 22 and shared region 44, as well as the dielectric liner 50 and conductor layer 52 as disposed in deep trenches 20, 22 with direct contact between the conductor layer 52 and the semiconductor substrate 10 as in the region analogous to shared region 44. The conductor layer 52 in the portion 54 of the deep trench isolation structure, the conductor layer 52 in the portion 56 of the deep trench isolation structure, and the conductor layer 52 in the portion 60 of the deep trench isolation structure are physically and electrically continuous. The conductor layer 52 in the portion 60 of the deep trench isolation region defines another electrical connection of the conductor layer 52 to the semiconductor substrate 10.

In an embodiment, the conductor layer 52 in the different portions 56, 60 of the deep trench isolation structure may be coupled to a power supply 62 and may be biased by the power supply 62. The interconnect structure includes contacts 64 and vertical interconnects 66, which include wiring and vias, that couple the power supply 62 to the portions 56, 60 of the deep trench isolation structure and thereby to the conductor layer 52. A potential difference applied between the portions 56, 60 of the deep trench isolation structure may collect and drain charge to avoid charge accumulation in the device region 25, which would be capable of causing damage to the device 58 if not drained.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor structure comprising:
 a semiconductor substrate including a device region; and
 a deep trench isolation structure in the semiconductor substrate, the deep trench isolation structure including a first portion, a second portion adjacent to the first portion, and a conductor layer in the first portion and the second portion, the conductor layer in the first portion of the deep trench isolation structure surrounding the device region, and the conductor layer in the second portion of the deep trench isolation structure defining a first electrical connection to the semiconductor substrate,
wherein the first portion of the deep trench isolation structure includes a first trench, the conductor layer is positioned in the first trench, the second portion of the deep trench isolation structure includes a second trench and a third trench, the conductor layer is positioned in the second trench and the third trench, the second trench and the third trench intersect over a shared region at which the conductor layer is electrically connected to the semiconductor substrate at a bottom of the shared region, the first trench has a closed-geometrical shape defined by an octagon having a first side, a second side, and a third side connecting the first side to the second side, and the second portion of the deep trench isolation structure is positioned adjacent to the third side.

2. The semiconductor structure of claim 1 wherein the conductor layer in the first portion of the deep trench isolation structure is electrically isolated from the semiconductor substrate, and the conductor layer in the first portion of the deep trench isolation structure fully surrounds the device region.

3. The semiconductor structure of claim 1 wherein the deep trench isolation structure includes a dielectric liner.

4. The semiconductor structure of claim 3 wherein the first trench has a plurality of sidewalls and a bottom, the conductor layer in the first portion of the deep trench isolation structure is positioned in the first trench, the dielectric liner is positioned between the conductor layer and the plurality of sidewalls of the first trench, and the dielectric liner is positioned between the conductor layer and the bottom of the first trench.

5. The semiconductor structure of claim 3 wherein the second trench and the third trench have a plurality of sidewalls and a bottom, the dielectric liner is positioned between the conductor layer and the plurality of sidewalls of the second trench and the third trench, and the conductor layer is electrically connected to the semiconductor substrate at the bottom of the second trench and the third trench.

6. The semiconductor structure of claim 5 wherein at least a portion of the bottom of the second trench and the third trench is free of the dielectric liner.

7. The semiconductor structure of claim 1 wherein the conductor layer in the first portion of the deep trench isolation structure is electrically isolated from the semiconductor substrate.

8. The semiconductor structure of claim 1 wherein the conductor layer is in direct contact with the semiconductor substrate over the bottom of the shared region.

9. The semiconductor structure of claim 1 wherein the third trench is aligned at an angle relative to the second trench.

10. The semiconductor structure of claim 1 wherein the third trench is aligned perpendicular to the second trench.

11. The semiconductor structure of claim 1 wherein the second trench and the third trench each intersect the first trench.

12. The semiconductor structure of claim 1 wherein the semiconductor substrate includes a portion bounded by a first tangent line to the first side of the octagon and a second tangent line to the second side of the octagon, and the second portion of the deep trench isolation structure is positioned adjacent to the third side of the octagon in the portion of the semiconductor substrate.

13. A semiconductor structure of claim 9 comprising:
a semiconductor substrate including a device region; and
a deep trench isolation structure in the semiconductor substrate, the deep trench isolation structure including a first portion, a second portion adjacent to the first portion, and a conductor layer in the first portion and the second portion, the conductor layer in the first portion of the deep trench isolation structure surrounding the device region, and the conductor layer in the second portion of the deep trench isolation structure defining a first electrical connection to the semiconductor substrate,
wherein the first portion of the deep trench isolation structure includes a first trench, the conductor layer is positioned in the first trench, the second portion of the deep trench isolation structure includes a second trench and a third trench, the conductor layer is positioned in the second trench and the third trench, the second trench and the third trench intersect over a shared region at which the conductor layer is electrically connected to the semiconductor substrate at a bottom of the shared region, the second trench and the third trench intersect at a plurality of corners arranged about the shared region, the second trench and the third trench outside of the shared region have a first width dimension, the shared region has a second width dimension on a diagonal between a pair of corners, and the second width dimension is greater than the first width dimension.

14. The semiconductor structure of claim 13 wherein the first trench has a third width dimension that is equal to the first width dimension and less than the second width dimension.

15. The semiconductor structure of claim 1 wherein the deep trench isolation structure includes a third portion adjacent to the first portion, the conductor layer is in the third portion, and the conductor layer in the third portion of the deep trench isolation structure defines a second electrical connection to the semiconductor substrate.

16. The semiconductor structure of claim 15 further comprising:
a power supply coupled to the first electrical connection to the semiconductor substrate and the second electrical connection to the semiconductor substrate.

17. A method comprising:
forming a deep trench isolation structure in a semiconductor substrate,
wherein the deep trench isolation structure includes a first portion, a second portion adjacent to the first portion, and a conductor layer in the first portion and the second portion, the conductor layer in the first portion of the deep trench isolation structure surrounds a device region of the semiconductor substrate, the conductor layer in the second portion of the deep trench isolation structure defines an electrical connection to the semiconductor substrate, the first portion of the deep trench isolation structure includes a first trench, the conductor layer is positioned in the first trench, the second portion of the deep trench isolation structure includes a second trench and a third trench, the conductor layer is positioned in the second trench and the third trench, the second trench and the third trench intersect over a shared region at which the conductor layer is electrically connected to the semiconductor substrate at a bottom of the shared region, the first trench has a closed-geometrical shape defined by an octagon having a first side, a second side, and a third side connecting the first side to the second side, and the second portion of the deep trench isolation structure is positioned adjacent to the third side.

18. The semiconductor structure of claim 13 wherein the conductor layer is in direct contact with the semiconductor substrate over the bottom of the shared region.

19. The semiconductor structure of claim 13 wherein the third trench is aligned at an angle relative to the second trench.

20. The semiconductor structure of claim 13 wherein the second trench and the third trench each intersect the first trench.

* * * * *